(12) United States Patent
Bartley et al.

(10) Patent No.: US 8,492,903 B2
(45) Date of Patent: Jul. 23, 2013

(54) THROUGH SILICON VIA DIRECT FET SIGNAL GATING

(75) Inventors: Gerald K. Bartley, Rochester, MN (US); Philip R. Germann, Oronoco, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 13/171,919

(22) Filed: Jun. 29, 2011

(65) Prior Publication Data

US 2013/0001676 A1 Jan. 3, 2013

(51) Int. Cl.
H01L 29/78 (2006.01)

(52) U.S. Cl.
USPC .......................................................... 257/774

(58) Field of Classification Search
USPC .......................................... 257/698, 773, 774
See application file for complete search history.

(56) References Cited

U.S. PATENT DOCUMENTS

| | | | |
|---|---|---|---|
| 5,801,417 A | 9/1998 | Tsang et al. | |
| 6,657,254 B2 | 12/2003 | Hshieh et al. | |
| 7,504,303 B2 | 3/2009 | Yilmaz et al. | |
| 7,625,793 B2 | 12/2009 | Calafut | |
| 7,633,165 B2 | 12/2009 | Hsu et al. | |
| 7,843,064 B2 | 11/2010 | Kuo et al. | |
| 2007/0052056 A1 | 3/2007 | Doi et al. | |
| 2009/0243676 A1* | 10/2009 | Feng | 327/157 |
| 2010/0032764 A1 | 2/2010 | Andry et al. | |
| 2010/0259296 A1* | 10/2010 | Or-Bach | 326/38 |
| 2011/0266683 A1 | 11/2011 | Feng | |
| 2012/0211829 A1* | 8/2012 | Bartley et al. | 257/332 |

OTHER PUBLICATIONS

S. W. Ho et al., "High RF Performance TSV Silicon Carrier for High Frequency Application." 58th Electronic Components and Technology Conference, ECTC 2008, May 27-30, 2008, pp. 1946-1952.

T. Yoshinaga et al., "Trends in R&D in TSV Technology for 3D LSI Packaging." Science & Technology Trends, Quarterly Review No. 37, Oct. 2010, pp. 26-39.

U.S. Appl. No. 12/966,303, Specification, (Not Yet Published), pp. 1-12.

U.S. Appl. No. 13/029,490, Specification, (Not Yet Published), pp. 1-15.

* cited by examiner

*Primary Examiner* — Thomas L Dickey
(74) *Attorney, Agent, or Firm* — Jim Boice (57) ABSTRACT

A system comprises a first integrated circuit (IC) chip that includes a first electronic component; a second IC chip that includes a second electronic component; a through silicon via (TSV) in the second IC chip that electrically couples the first electronic component to the second electronic component; and a signal gating transistor that fully occludes the TSV.

10 Claims, 11 Drawing Sheets

THROUGH SILICON VIA DIRECT FET SIGNAL GATING

BACKGROUND

The present disclosure relates to the field of computers, and more specifically to chips used in computers.

SUMMARY

According to one embodiment, the present invention is a system that comprises a first integrated circuit (IC) chip that includes a first electronic component; a second IC chip that includes a second electronic component; a through silicon via (TSV) in the second IC chip that electrically couples the first electrical component to the second electronic component; and a signal gating transistor that fully occludes the TSV.

According to one embodiment, the present invention is a hardware description language (HDL) design structure encoded on a machine-readable data storage medium. The HDL design structure comprises elements that, when processed in a computer-aided design system, generate a machine-executable representation of a signal gating transistor within a though silicon via (TSV) in an integrated circuit (IC) chip. The TSV in the IC chip is a field effect transistor (FET) that comprises: a dielectric surface on a bore of the TSV; a doped semiconductor region surrounding the dielectric surface; a first epitaxial region at a bottom of the TSV of a first doping; a second epitaxial region grown on a top of the first epitaxial region, the second epitaxial region having opposite doping of the first epitaxial region; and a third epitaxial region grown on a top of the second epitaxial region, the third epitaxial region having opposite doping of the second epitaxial region, wherein the doped semiconductor region surrounding the dielectric surface is a gate dielectric of the FET, the first and third epitaxial regions respectively are source and drain regions of the FET, the second epitaxial region is a body of the FET, and the FET fully occludes the TSV.

According to one embodiment, the present invention is a computer system that comprises stacked chips on a circuit board. The stacked chips comprise: a first integrated circuit (IC) chip comprising a first electronic component; a second IC chip comprising a second electronic component; a through silicon via (TSV) in the second IC chip that electrically couples the first electronic component to the second electronic component; and a signal gating transistor that fully occludes the TSV.

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
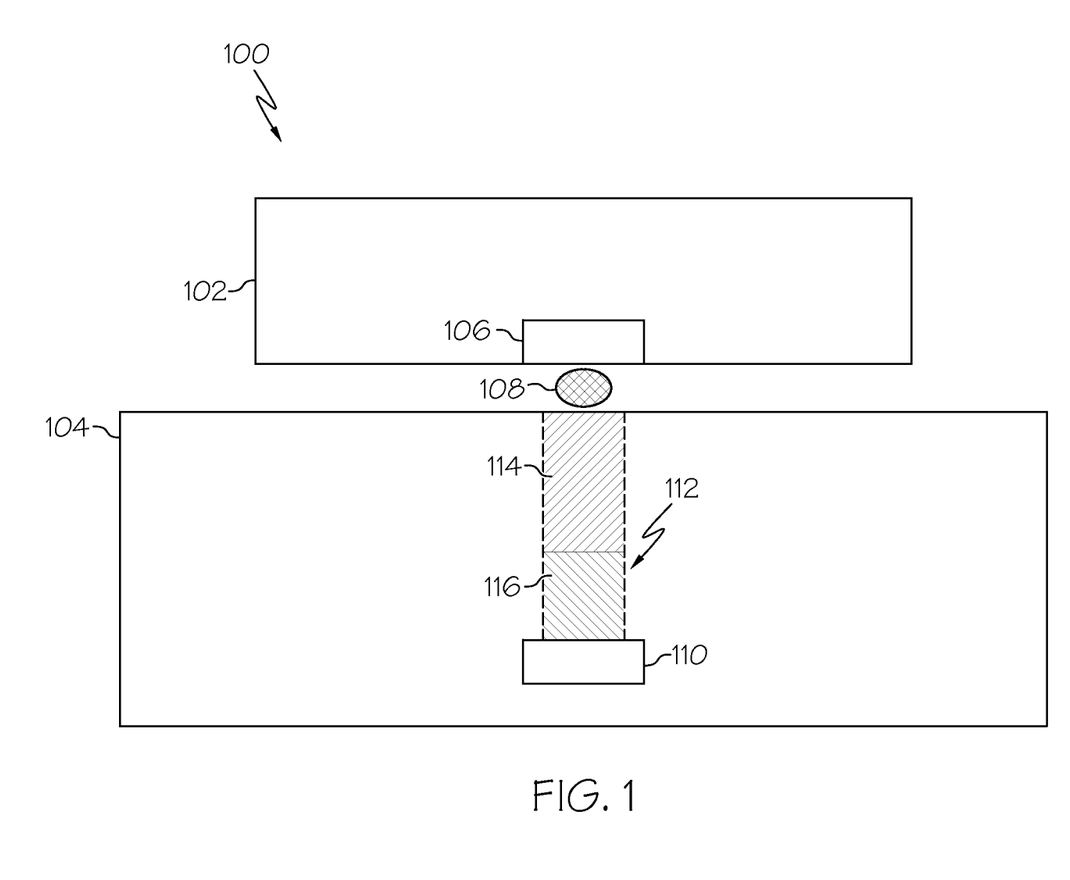
FIG. 1 depicts an exemplary system of stacked integrated circuit (IC) chips that are electrically coupled by an inventive signal gating transistor that fully occludes a through silicon via (TSV) in one of the IC chips.

With reference now to the figures, and in particular to FIG. 1, an exemplary system 100 includes a first integrated circuit (IC) chip 102 and a second IC chip 104. The first IC chip 102 is mounted directly on top of the second IC chip 104, and the second IC chip 104 may be mounted to another IC chip (not shown) or a circuit board (also not shown). Stacking IC chips allows for direct connection between IC chips, in order to minimize the signal decay, excessive heat, etc. that occurs when IC chips are each mounted separately on a circuit board.

As depicted in exemplary manner, the first IC chip 102 has a first electronic component 106 (e.g., a circuit, a power unit, a wire, a logic array, a bus, etc.) that is electrically connected to a connector 108. As contemplated in one embodiment of the present invention, the connector 108, which may be a chip connector (e.g., a solder ball) in a ball grid array, connects the first electronic component 106 to a second electronic component 110 (in the second IC chip 104) via a through silicon via (TSV) 112. The TSV 112 comprises a refractory metal 114, which electrically couples the connector 108 to the present inventive signal gating transistor 116, which is electrically coupled to the second electronic component 110. As depicted, the signal gating transistor 116 allows the first electronic component 106 to control signals going to (and in one embodiment, from) the second electronic component 110. These signals may have been generated by the first electronic component 106, or they may be generated by another component (not shown) within the first IC chip 102 or any other IC chip, device, etc. (also not shown). In one embodiment, the process may be commutative, such that the second electronic component 110 controls signals going to (and from) the first electronic component 106. These signals may be power signals, data signals, control signals, etc. That is, according to various embodiments of the present invention, the signal gating transistor 116 controls the flow of 1) electrical power to a chip and/or component; 2) data signals (e.g., data, instructions, etc.) to a chip/circuit/component; and/or 3) control signals (including timing signals, on/off control signals, bus controller signals, etc.) to a device such as a logic chip/bus/ etc.

Figure 2:
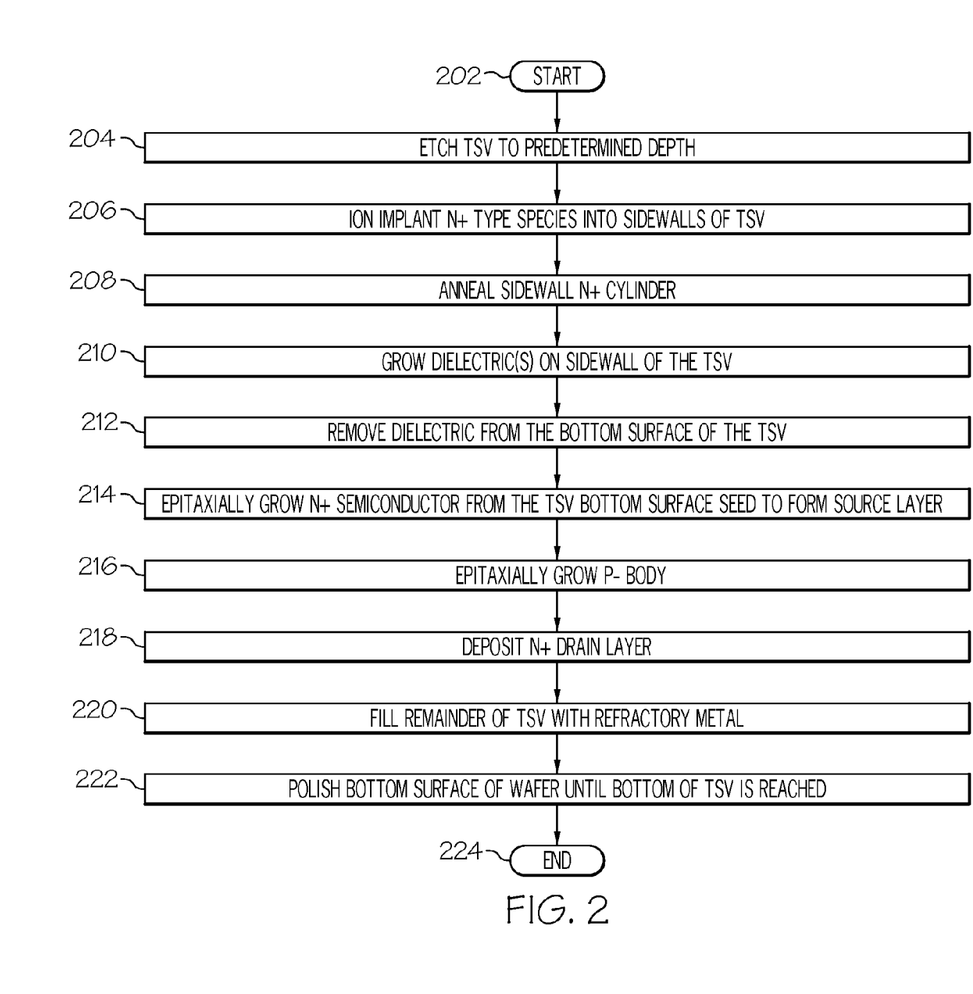
FIG. 2 is a high level flow chart of exemplary steps taken to fabricate the inventive signal gating transistor depicted in FIG. 1.
Figure 3:
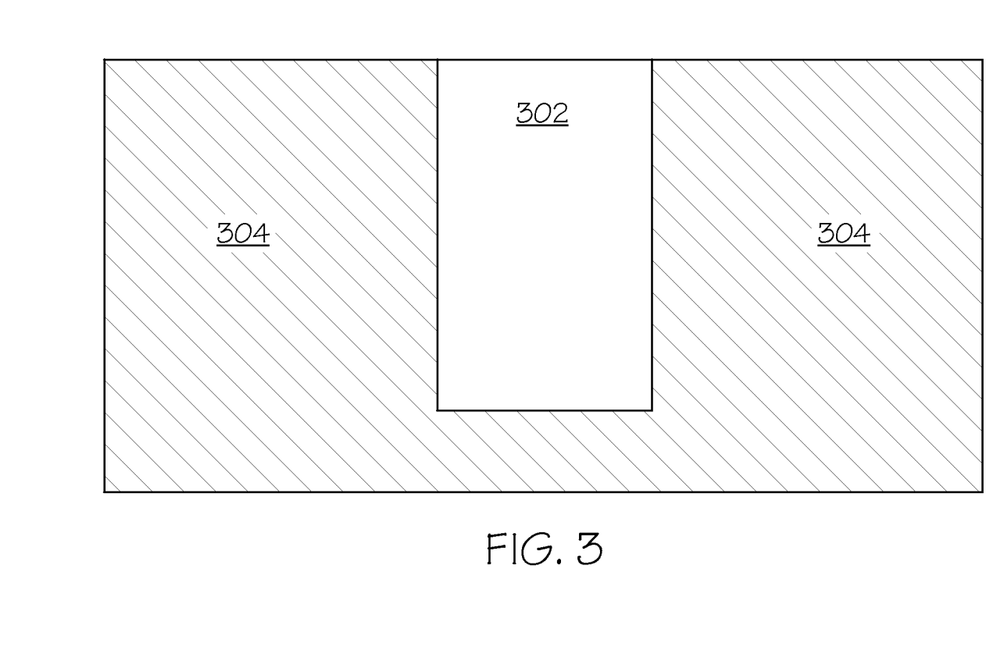
FIGS. 3-8 illustrate detail of steps taken to fabricate the inventive signal gating transistor depicted in FIG. 1.

With reference now to FIG. 2, a high level flow chart of exemplary steps taken to fabricate the inventive signal gating transistor 116 depicted in FIG. 1 is presented. After initiator block 202, an initial through silicon via (TSV) is etched into a bulk substrate (e.g., substrate that will form the second IC chip 104 shown in FIG. 1) to a predetermined depth (e.g., 40 µm), as described in block 204. As depicted in an exemplary manner in FIG. 3, a through silicon via (TSV) 302 is etched in a P type bulk substrate 304 for 40 µm. As described below, the bulk semiconductor below the bottom of the TSV 302 will be utilized only as a seed for epitaxial semiconductor growth and will ultimately be polished away.

Figure 4:
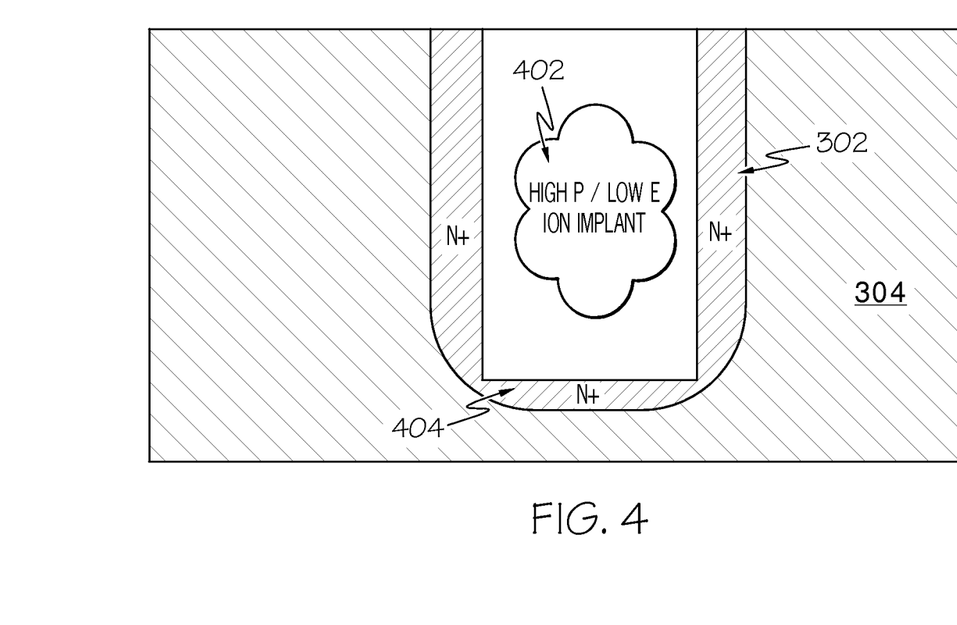

As described in block 206 of FIG. 2, an ion implant via high pressure and low energy causes a high dose of N+ type doping into the sidewalls of the TSV. In one embodiment, lighter species of such doping, such as phosphorus, enhance the migration and activation described herein. Thus, as shown in FIG. 4, the high pressure/low energy ion implant 402 causes a layer of N+ doping material 404 to be applied to the sidewalls of the TSV 302. As described in block 208 of FIG. 2, the N+ doping material 404 is then annealed/activated to the sidewalls of the TSV 302. As described below, this N+ doping material 404 will ultimately become the gate electrode for the FET described herein.

Figure 5:
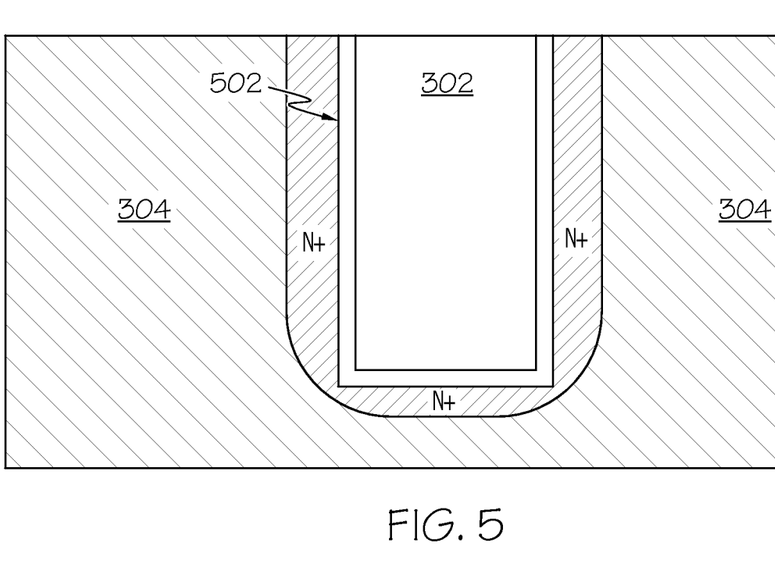
Figure 6:
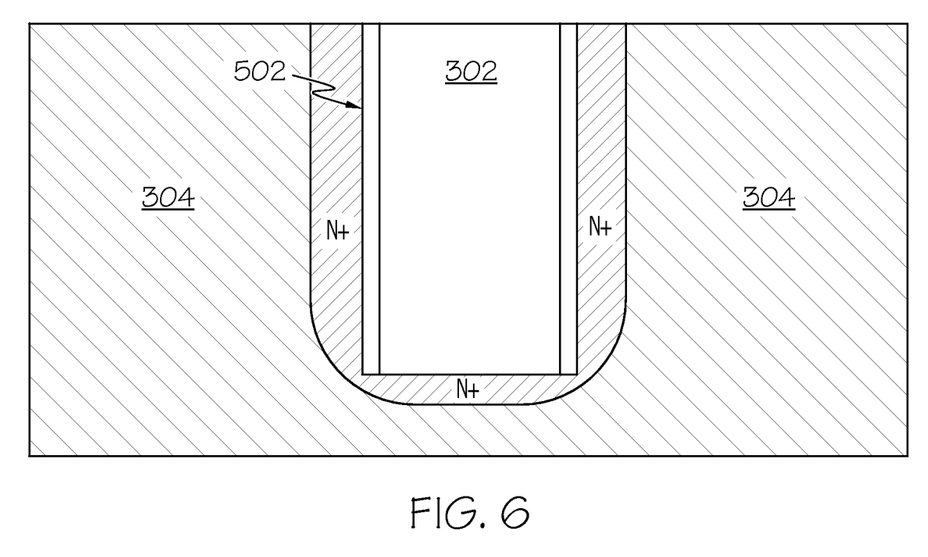

With reference now to block 210 of FIG. 2, a layer of dielectric(s) are then grown/deposited on the sidewalls of the TSV 302. This dielectric is shown in exemplary form as a layer of dielectric 502 (e.g., silicon dioxide) in FIG. 5. As described in block 212 of FIG. 2 and depicted in FIG. 6, the dielectric is then removed from the bottom surface of the TSV 302 with a very low pressure, very high voltage bias plasma reactive-ion etching (RIE). In one embodiment, an aspect ratio (depth/diameter ratio) of 3 is optimal.

Figure 7:
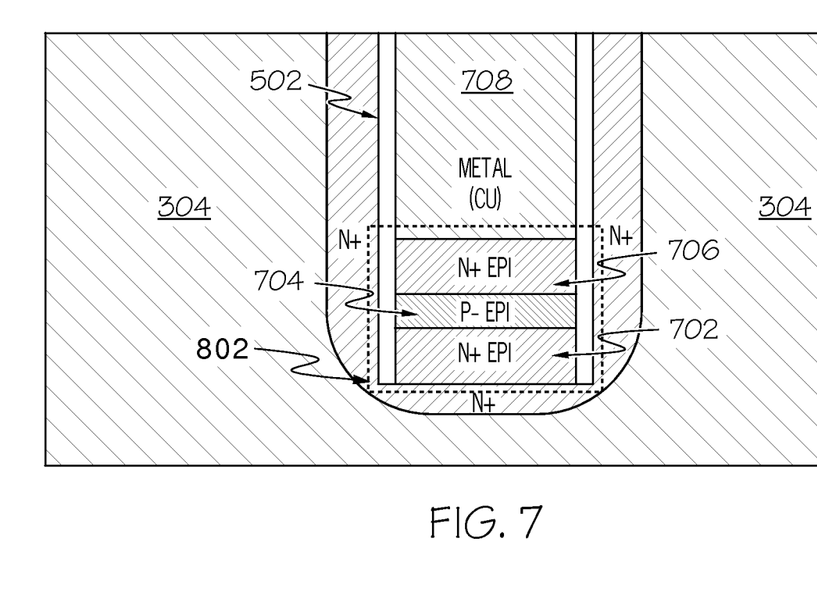

Referring now to FIG. 7 and to block 214 of FIG. 2, a heavily doped N+ semiconductor is epitaxially grown (i.e., a thin layer on the surface of the N+ semiconductor crystal is grown so that the layer has the same structure as the underlying crystal) from the TSV bottom surface "seed" (e.g., the N+ semiconductor below the original TSV 302). This epitaxial growth occludes (fills in) the bore of the original TSV 302 shown in FIG. 3, while the dielectric 502 prevents any undue sidewall growth. This epitaxial growth forms what will become the source 702 (shown in FIG. 7) of an n-channel field effect transistor (NFET).

As described in block 216 of FIG. 2, after approximately 5 µm of epitaxial growth of N+ semiconductor to form the source 702, the doping species is abruptly changed to boron to form the P layer that will become the body 704 of the NFET. This body is formed by epitaxially depositing approximately 0.05 µm of this P type (e.g., boron doped) semiconductor. Note that the body 704 also occludes what was the original TSV 302 shown in FIG. 3. Note further that the amounts of growth/depositing/etc. described herein are for exemplary purposes only, and are not to be construed as limiting the scope/range of embodiments contemplated by the present invention.

As described in block 218 of FIG. 2, the epitaxial doping species is abruptly switched back to N+ for continued deposition of another 5 µm, thus forming what will become the drain 706 of the NFET. Note further that the drain 706 also fully occludes what was the original TSV 302 shown in FIG. 3. As described in block 220 of FIG. 2, the remaining upper portion of the TSV 302 is filled with a refractory metal 708 such as copper, which is then top-polished.

Figure 8:
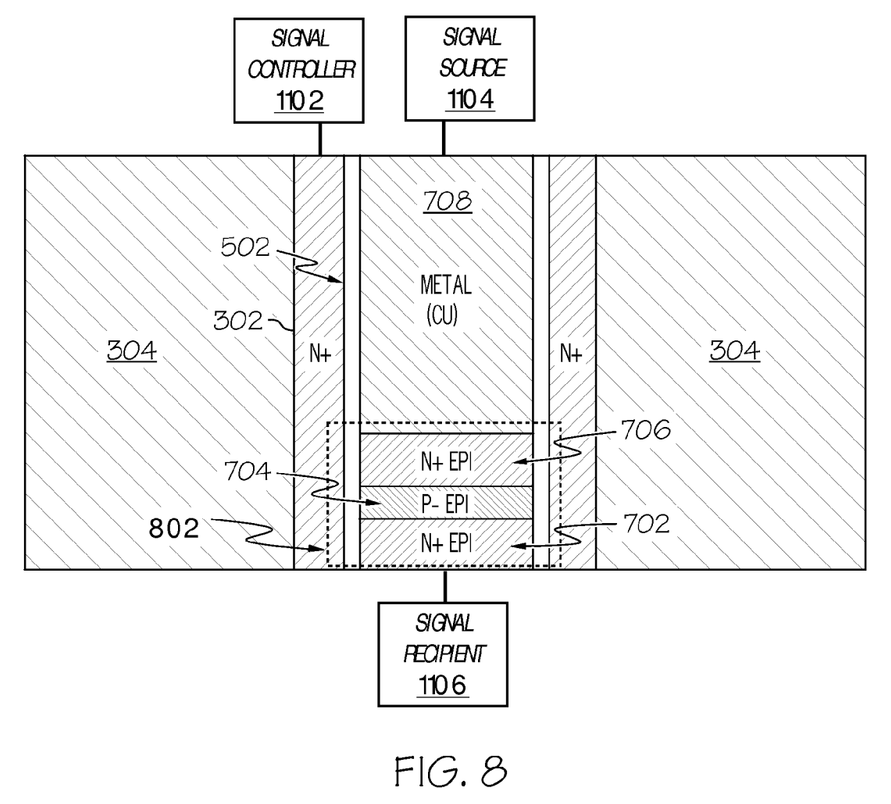

As described in block 222 of FIG. 2 and illustrated in FIG. 8, the "bottom" surface of the wafer is polished away until reaching the bottom of what was the original TSV 302. This structure results in a vertical NFET 802 that completely fills (occludes) the original TSV 302. Note that N+ doping material 404 functions as a control gate of the NFET 802 by virtue of covering the P− Epi (body 704) with an interlaying of the dielectric 502 between the body 704 and the gate (N_doping material 404). Note also the N+ doping material 404 can be biased to a high positive value with the reversed biased diode to the substrate. In one embodiment, the resulting NFET 802 has a circumference of 63 µm, which fits within a standard sized TSV (assuming a 20 µm diameter TSV), and yet provides a current carrying potential of ~50 mA at approximately 250 mohm of impedance.

In one embodiment, the NFET 802 depicted in FIG. 8 is used by a first electronic device (e.g., the first electronic component 106 depicted in FIG. 1) to power gate (e.g., turn power on and off) power to a second electronic device (e.g., the second electronic component 110 depicted in FIG. 1). An exemplary power calculation is as follows: Assume that the circuit board has multiple 20 µm TSVs with a 50 µm pitch (center-to-center spacing between TSVs), and that ¼ of the TSVs are used for power gating. This results in a total of 400 TSV per mm$^2$, such that 100 TSVs would be allocated to power delivery. This scenario allows the system to supply 400/4*50 mA (current per TSV), which is approximately 5 A/mm$^2$. By limiting the power to 1 A/mm$^2$ (for thermal stability), a 1 A/mm$^2$ load results in a series drop in the TSV to be between 2 and 3 mV, which is desirable.

In another embodiment, the NFET 802 depicted in FIG. 8 is used to control what data/control signals are allowed to pass from a first electronic device (e.g., the first electronic component 106 depicted in FIG. 1) to a second electronic device (e.g., the second electronic component 110 depicted in FIG. 1). The voltage/amperage limits described when using the NFET 802 in power gating also applies in this usage.

The presently described NFET that fully occludes the TSV provides very low leakage current, as well as high input capacitance that minimizes load spikes and affords reasonable power load waveforms as compared to prior art power gates on the system on a chip (SoC).

An NFET is assumed in one embodiment of the present invention; however, a PFET could also be fabricated in another embodiment by adjusting the doping, etc. during fabrication. Note also that while the drawings indicate an "interposer" implementation for power gating and decoupling, the present invention contemplates and includes other embodiments of different types of transistors (CMOS, etc.).

Note also that as used in the present specification, the terms "occlude" and/or "fully occlude" are used in one embodiment to indicate that, by virtue of the herein-described epitaxial growth and/or depositing used to create the source 702, body 704, and drain 706 depicted in FIG. 8, the final NFET 802 shown in FIG. 8 completely "fills in" the space/void originally created by the TSV 302, thereby occluding the bore of the TSV 302 for a portion of the length of the TSV 302 used to hold the NFET 802.

Figure 9:
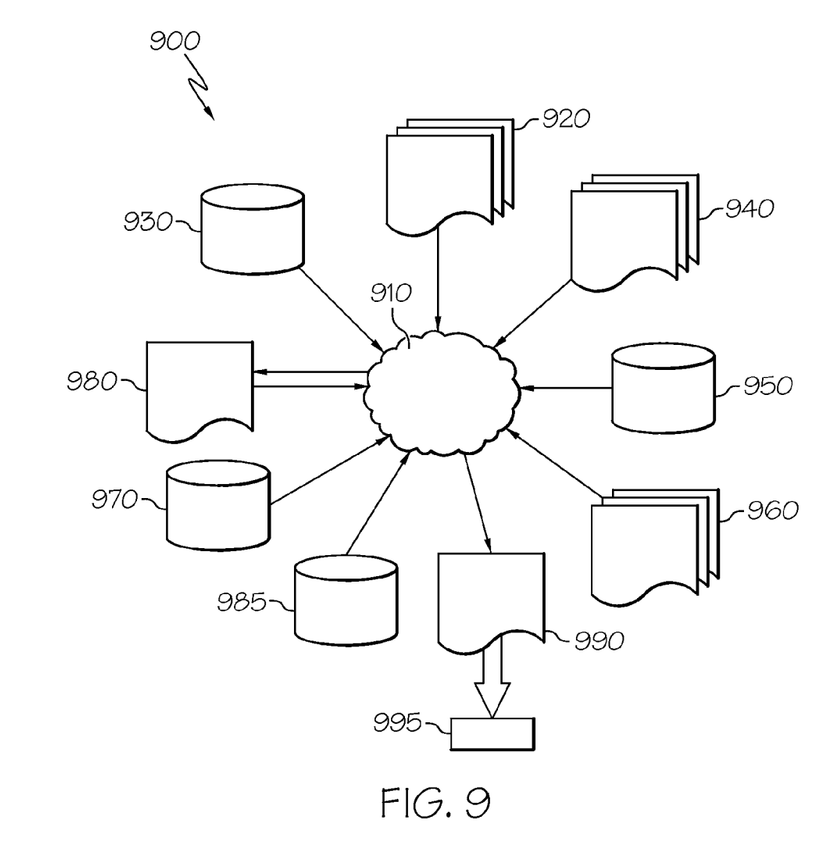
FIG. 9 is a flow diagram of a design process used in semiconductor design, manufacture, and/or test of the inventive signal gating transistor depicted in FIG. 1.

Referring now to FIG. 9, there is depicted a block diagram of an exemplary design flow 900 used, for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 3-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 3-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 3-8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 3-8. In one embodiment, design structure 990 may comprise a compiled, executable HDL simulation model that functionally simulates the devices shown in FIGS. 1 and 3-8.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 3-8. Design structure 990 may then proceed to a stage 995 where, for example, design structure 990: proceeds to tape-out, is released to manufacturing, is released to a mask house, is sent to another design house, is sent back to the customer, etc.

Figure 10:
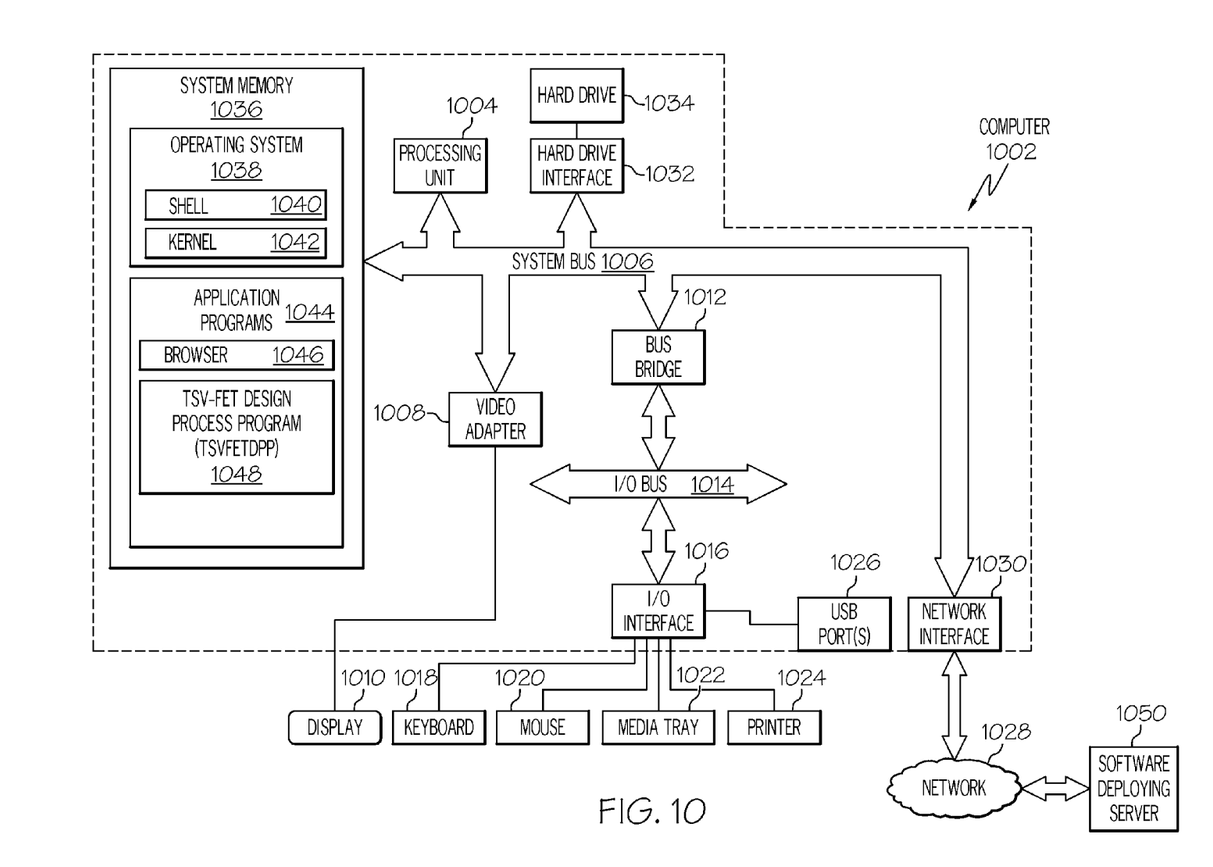
FIG. 10 depicts an exemplary computer system in which the inventive signal gating transistor depicted in FIG. 1 may be utilized and/or in which the design process described in FIG. 9 may be implemented.

With reference now to FIG. 10, there is depicted a block diagram of an exemplary computer 1002, which may be utilized by the present invention. This utilization may be in the form of one or more circuits/chips/boards that incorporate the TSV-occluding FET described above in FIGS. 1-8, and/or in creating/using the design structure described above in FIG. 9. Note that some or all of the exemplary architecture, including both depicted hardware and software, shown for and within computer 1002 may be utilized by software deploying server 1050.

Computer 1002 includes a processing unit 1004 that is coupled to a system bus 1006. Processing unit 1004 may utilize one or more processors, each of which has one or more processor cores. A video adapter 1008, which drives/supports a display 1010, is also coupled to system bus 1006. System bus 1006 is coupled via a bus bridge 1012 to an input/output (I/O) bus 1014. An I/O interface 1016 is coupled to I/O bus 1014. I/O interface 1016 affords communication with various I/O devices, including a keyboard 1018, a mouse 1020, a media tray 1022 (which may include storage devices such as CD-ROM drives, multi-media interfaces, etc.), a printer 1024, and external USB port(s) 1026. While the format of the ports connected to I/O interface 1016 may be any known to those skilled in the art of computer architecture, in one embodiment some or all of these ports are universal serial bus (USB) ports.

As depicted, computer 1002 is able to communicate with a software deploying server 1050 using a network interface 1030. Network 1028 may be an external network such as the Internet, or an internal network such as an Ethernet or a virtual private network (VPN).

A hard drive interface 1032 is also coupled to system bus 1006. Hard drive interface 1032 interfaces with a hard drive 1034. In one embodiment, hard drive 1034 populates a system memory 1036, which is also coupled to system bus 1006. System memory is defined as a lowest level of volatile memory in computer 1002. This volatile memory includes additional higher levels of volatile memory (not shown), including, but not limited to, cache memory, registers and buffers. Data that populates system memory 1036 includes computer 1002's operating system (OS) 1038 and application programs 1044.

OS 1038 includes a shell 1040, for providing transparent user access to resources such as application programs 1044. Generally, shell 1040 is a program that provides an interpreter and an interface between the user and the operating system. More specifically, shell 1040 executes commands that are entered into a command line user interface or from a file. Thus, shell 1040, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 1042) for processing. Note that while shell 1040 is a text-based, line-oriented user interface, the present invention will equally well support other user interface modes, such as graphical, voice, gestural, etc.

As depicted, OS 1038 also includes kernel 1042, which includes lower levels of functionality for OS 1038, including providing essential services required by other parts of OS 1038 and application programs 1044, including memory management, process and task management, disk management, and mouse and keyboard management.

Application programs 1044 include a renderer, shown in exemplary manner as a browser 1046. Browser 1046 includes program modules and instructions enabling a world wide web (WWW) client (i.e., computer 1002) to send and receive network messages to the Internet using hypertext transfer protocol (HTTP) messaging, thus enabling communication with software deploying server 1050 and other computer systems.

Application programs 1044 in computer 1002's system memory (and, in one embodiment, software deploying server 1050's system memory) also include a TSV-FET design process program (TSVFETDPP) 1048. TSVFETDPP 1048 includes code for implementing the processes described below, including those described in FIGS. 2-8. In one embodiment, computer 1002 is able to download TSVFETDPP 1048 from software deploying server 1050, including in an on-demand basis, wherein the code in TSVFETDPP 1048 is not downloaded until needed for execution to design and/or fabricate the chips described herein. Note further that, in one embodiment of the present invention, software deploying server 1050 performs all of the functions associated with the present invention (including execution of TSVFETDPP 1048), thus freeing computer 1002 from having to use its own internal computing resources to execute TSVFETDPP 1048.

The hardware elements depicted in computer 1002 are not intended to be exhaustive, but rather are representative to highlight essential components required by the present invention. For instance, computer 1002 may include alternate memory storage devices such as magnetic cassettes, digital versatile disks (DVDs), Bernoulli cartridges, and the like. These and other variations are intended to be within the spirit and scope of the present invention.

Figure 11:
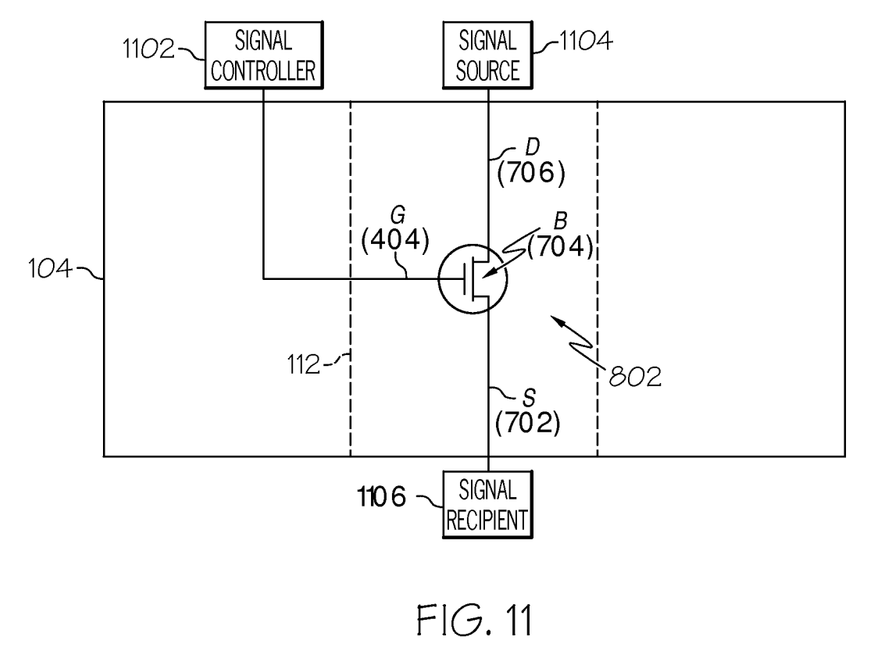
FIG. 11 is a schematic drawing of the n-channel field effect transistor (NFET) depicted in FIG. 8.

With reference now to FIG. 11, a schematic diagram of the final NFET 802 depicted in FIG. 8, depicted within an exemplary environment, is presented. The NFET 802 is made up of a drain D (equivalent to drain 706 shown in FIG. 8), a source S (equivalent to source 702 shown in FIG. 8), and a body B (equivalent to body 704 shown in FIG. 8). Note that the NFET 802 passes through the second IC chip 104 through the TSV 112 (shown in FIG. 1), and that the NFET 802 fully occludes (fills up) the TSV 112 with its structure. The gate G (analogous to the N+ doping material 404 described above) is controlled by a signal controller 1102, which may be a separate control logic such as a gate, multiplexer, etc., or it may be part of a signal source 1104. Note that both the signal controller 1102 and the signal source 1104 may be part of the first electronic component 106 shown in FIG. 1; or both the signal controller 1102 and the signal source 1104 may be part of the first IC chip 102 shown in FIG. 1 but in different components/areas of the first IC chip 102; or the signal controller 1102 may be in the first IC chip 102 shown in FIG. 1 while the signal source 1104 may be from a device outside (not shown in FIG. 1) of the first IC chip 102. The output from the signal source 1104 may fulfill any of several functions: it may provide power to the signal recipient 1106 (e.g., the second electronic component 110 depicted in FIG. 1), or it may include data/instructions/control signals that provide information and/or control inputs to the signal recipient 1106, which is analogous to the second electronic component 110 shown in FIG. 1.

With reference again to FIG. 8, which is analogous to the circuit diagram shown in FIG. 11, a gate (gate electrode) is formed by the N+ doping material 404 that circumferentially surrounds the bore of the TSV 302. The dielectric 502 serves as a gate dielectric, allowing the N+ doping material 404 (i.e., the gate electrode) to control current between a first N+ epi (e.g., source 702) and a second N+ epi (e.g., drain 706) through a channel in P– Epi (e.g., the body 704 of the FET). Refractory metal 708 (e.g., copper, titanium, etc) is technically not part of the FET other than being a conductor to carry current from drain 706 to a top surface of P– substrate 304 for further connection to signal source 1104 (e.g., via a connector such as connector 108 shown in FIG. 1). The source 702 of the NFET 802 is electrically coupled to the signal recipient 1106 (e.g., via a solder bump—not shown).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having thus described embodiments of the invention of the present application in detail and by reference to illustrative embodiments thereof, it will be apparent that modifications and variations are possible without departing from the scope of the invention defined in the appended claims. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a first integrated circuit (IC) chip comprising a first electronic component;
   a second IC chip comprising a second electronic component;
   a through silicon via (TSV) in the second IC chip;
   a layer of dielectric that lines the TSV;
   a refractory metal conductor that fully occludes a first portion of the TSV inside the layer of dielectric; and
   a signal gating transistor having a source, drain, or channel that fully occludes a second portion of the TSV inside the layer of dielectric, wherein the first electronic component and the second electronic component are electrically coupled via the refractory metal conductor and the signal gating transistor.

2. The system of claim 1, wherein the signal gating transistor modulates a signal from the first electronic component to the second electronic component.

3. The system of claim 2, wherein the signal gating transistor is a field effect transistor (FET), and wherein the FET comprises:

a dielectric surface within a bore of the TSV;
a doped semiconductor region surrounding the dielectric surface;
a first epitaxial region at a bottom of the TSV of a first doping;
a second epitaxial region grown on a top of the first epitaxial region, the second epitaxial region having opposite doping of the first epitaxial region; and
a third epitaxial region grown on a top of the second epitaxial region, the third epitaxial region having opposite doping of the second epitaxial region, wherein
the doped semiconductor region surrounding the dielectric surface is a gate dielectric of the FET, the first and third epitaxial regions respectively are source and drain regions of the FET, and the second epitaxial region is a body of the FET.

4. The system of claim 3, wherein the dielectric surface is silicon dioxide.

5. The system of claim 2, wherein the signal is power to the second electronic component.

6. The system of claim 2, wherein the signal is a data signal to the second electronic component.

7. A computer system comprising stacked chips on a circuit board, wherein the stacked chips comprise:
a first integrated circuit (IC) chip comprising a first electronic component;
a second IC chip comprising a second electronic component;
a through silicon via (TSV) in the second IC chip;
a layer of dielectric that lines the TSV;
a refractory metal conductor that fully occludes a first portion of the TSV inside the layer of dielectric; and
a signal gating transistor having a source, drain, or channel that fully occludes a second portion of the TSV inside the layer of dielectric, wherein the first electronic component and the second electronic component are electrically coupled via the refractory metal conductor and the signal gating transistor.

8. The computer system of claim 7, wherein the signal gating transistor is a field effect transistor (FET), and wherein the FET comprises:
a dielectric surface within a bore of the TSV;
a doped semiconductor region surrounding the dielectric surface;
a first epitaxial region at a bottom of the TSV of a first doping;
a second epitaxial region grown on a top of the first epitaxial region, the second epitaxial region having opposite doping of the first epitaxial region; and
a third epitaxial region grown on a top of the second epitaxial region, the third epitaxial region having opposite doping of the second epitaxial region, wherein
the doped semiconductor region surrounding the dielectric surface is a gate dielectric of the FET, the first and third epitaxial regions respectively are source and drain regions of the FET, and the second epitaxial region is a body of the FET.

9. The computer system of claim 8, wherein the signal gating transistor modulates a signal from the first electronic component to the second electronic component, and wherein the signal is power to the second electronic component.

10. The computer system of claim 8, wherein the signal gating transistor modulates a signal from the first electronic component to the second electronic component, and wherein the signal is a data signal to the second electronic component.

* * * * *